United States Patent
Lin et al.

(10) Patent No.: US 10,468,494 B2
(45) Date of Patent: Nov. 5, 2019

(54) HIGH-VOLTAGE DEVICE AND METHOD FOR FABRICATING THE SAME

(71) Applicant: UNITED MICROELECTRONICS CORP., Hsinchu (TW)

(72) Inventors: Chih-Mou Lin, Tainan (TW);
Chin-Chia Kuo, Tainan (TW);
Ming-Hua Tsai, New Taipei (TW);
Su-Hua Tsai, Hsinchu (TW); Pai-Tsang Liu, Hsinchu (TW); Chiao-Yu Li, Tainan (TW); Chun-Ning Wu, Tainan (TW); Wei-Hsuan Chang, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 9 days.

(21) Appl. No.: 15/892,671

(22) Filed: Feb. 9, 2018

(65) Prior Publication Data
US 2019/0252513 A1  Aug. 15, 2019

(51) Int. Cl.
| H01L 29/49 | (2006.01) |
| H01L 29/06 | (2006.01) |
| H01L 29/51 | (2006.01) |
| H01L 21/28 | (2006.01) |
| H01L 29/78 | (2006.01) |
| H01L 29/66 | (2006.01) |
| H01L 21/3115 | (2006.01) |
| H01L 21/3215 | (2006.01) |

(52) U.S. Cl.
CPC .... *H01L 29/4983* (2013.01); *H01L 21/28185* (2013.01); *H01L 21/31155* (2013.01); *H01L 29/0619* (2013.01); *H01L 29/0653* (2013.01); *H01L 29/512* (2013.01); *H01L 29/66568* (2013.01); *H01L 29/7841* (2013.01); *H01L 21/28035* (2013.01); *H01L 21/28079* (2013.01); *H01L 21/32155* (2013.01)

(58) Field of Classification Search
USPC ........................................................ 257/402
See application file for complete search history.

(56) References Cited

U.S. PATENT DOCUMENTS

| 7,244,975 | B2 | 7/2007 | Chen et al. |
| 9,406,771 | B1 | 8/2016 | Hsiao et al. |
| 2005/0269648 | A1* | 12/2005 | Basceri ............ H01L 21/28194 257/410 |
| 2006/0273393 | A1* | 12/2006 | Chidambarrao .... H01L 21/2822 257/347 |

(Continued)

*Primary Examiner* — Nilufa Rahim
(74) *Attorney, Agent, or Firm* — WPAT, PC (57) ABSTRACT

A high-voltage device includes a semiconductor substrate, a source diffusion region, a drain diffusion region, a channel diffusion region and a gate electrode. The source diffusion region and the drain diffusion region with a first conductive type are disposed in the semiconductor substrate. The channel diffusion region is disposed in the semiconductor substrate and between the source diffusion region and the drain diffusion region. The gate dielectric layer is disposed on the channel diffusion region and having a first modified portion with a second conductive type extending inwards from a first edge of the gate dielectric layer. The gate electrode is disposed on the gate electric layer, wherein the first modified portion, the gate electrode and the channel diffusion region at least partially overlap with each other.

10 Claims, 9 Drawing Sheets

(56) References Cited

U.S. PATENT DOCUMENTS

2009/0108294 A1* 4/2009 Choi ................. H01L 21/28088
257/190
2009/0294848 A1* 12/2009 Chang ............... H01L 21/28105
257/335
2011/0068348 A1* 3/2011 Passlack ........... H01L 29/66522
257/76

* cited by examiner

HIGH-VOLTAGE DEVICE AND METHOD FOR FABRICATING THE SAME

BACKGROUND

Technical Field

The disclosure relates in generally to a semiconductor device and the method for fabricating the same, and more particularly to a high-voltage device and the method for fabricating the same.

Description of the Related Art

A high-voltage device, such as a high-voltage metal oxide semiconductor (HVMOS) device that can prevent current leakage under high voltage, presently has been applied in various electronic apparatus, including central processing unit (CPU) power supplies, power management systems and alternating current/direct current (AC/DC) converters.

A typical HVMOS device includes a semiconductor substrate having a source diffusion region, a drain diffusion region and a channel region connecting portions of the source diffusion region and the drain diffusion region, a gate structure covering the channel region, and an isolation structure located in the semiconductor substrate to properly isolate the source diffusion region, the drain diffusion region and the channel region from other devices. However, due to the ever-decreasing element size in semiconductor technology, the source diffusion region, the drain diffusion region and the isolation structure which is floating connected are so close that parasitic current may be generated to trigger off-state leakages, known as a kink effect, or to result in a snapback effect that can damage the HVMOS device.

Therefore, there is a need of providing an improved high-voltage device and the method for fabricating the same to obviate the drawbacks encountered from the prior art.

SUMMARY

One aspect of the present disclosure is to provide a high-voltage device, wherein the high-voltage device includes a semiconductor substrate, a source diffusion region, a drain diffusion region, a channel diffusion region and a gate electrode. The source diffusion region and the drain diffusion region with a first conductive type are disposed in the semiconductor substrate. The channel diffusion region is disposed in the semiconductor substrate and between the source diffusion region and the drain diffusion region. The gate dielectric layer is disposed on the channel diffusion region and having a first modified portion with a second conductive type extending inwards from a first edge of the gate dielectric layer. The gate electrode is disposed on the gate dielectric layer, wherein the first modified portion, the gate electrode and the channel diffusion region at least partially overlap with each other.

Another aspect of the present disclosure is to provide a method for fabricating a high-voltage device, wherein the method includes steps as follows: A semiconductor substrate is firstly provided. A source diffusion region, a drain diffusion region and a channel diffusion region are then formed in the semiconductor substrate, wherein the source diffusion region and the drain diffusion region have a first conductive type and the channel diffusion region is disposed between the source diffusion region and a drain diffusion region. After a gate dielectric layer is formed on the channel diffusion region, a first ion implantation is performed to drive a plurality of dopants with a second conductive type into the gate dielectric layer to form a first modified portion extending inwards from a first edge of the gate dielectric layer. Subsequently, a gate electrode is formed on the gate dielectric layer to make the first modified portion, the gate electrode and the channel diffusion region at least partially overlapping with each other.

In accordance with the aforementioned embodiments of the present disclosure, a high-voltage device and the method for fabricating the same are provided. After forming a source diffusion region, a drain diffusion region and a channel diffusion region in the semiconductor substrate, a gate dielectric layer having a modified portion with a conductivity type other than that of the source diffusion region and the drain diffusion region is formed on the channel diffusion region. A gate electrode is then formed on the gate dielectric layer to make the modified portion, the gate electrode and the channel diffusion region at least partially overlapping with each other.

Because the modified portion has conductive type opposite to that of the source diffusion region and the drain diffusion region that can improve the dielectric property of the gate dielectric layer, thus the threshold voltage (Vt) of the high-voltage device can be increased. In some embodiments of the preset disclosure, the modified portion may extend inwards from an edge of the gate dielectric layer to provide a local-increased parasitic capacitance at the edge of the gate dielectric layer which is located between the drain diffusion region and the source diffusion region and adjacent to the device insulation structure, to prevent current leakage due to the kink effect and the snapback effect that can damage the high-voltage device from being triggered.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

The embodiments as illustrated below provide a high-voltage device and the method for fabricating the same to solve the problem of current leakage due to the kink effect and prevent the high-voltage device from being damaged. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

Figure 1:
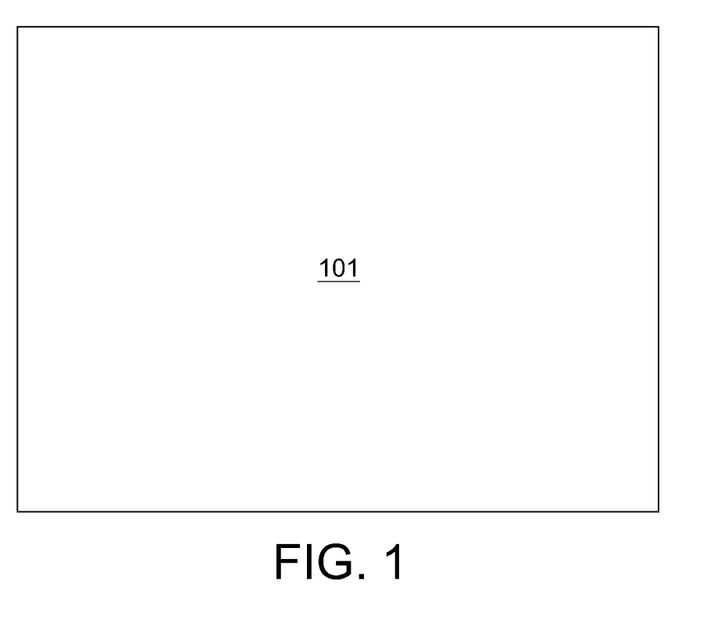
FIG. 1 is a top view illustrating a semiconductor substrate for fabricating a high-voltage device in accordance with one embodiment of the present disclosure.

The method for fabricating the high-voltage device 100 includes steps as follows: Firstly, a semiconductor substrate 101 is provided. FIG. 1 is a top view illustrating a semiconductor substrate 101 for fabricating a high-voltage device 100 in accordance with one embodiment of the present disclosure. In some embodiments of the present disclosure, the semiconductor substrate 101 can be a semiconductor substrate made of semiconductor materials (such as silicon (Si), germanium (Ge), and so on), compound semiconductor materials (such as gallium arsenide (GaAs)).

However, in some other embodiments, the semiconductor substrate 101 can include other layer. For example, in one embodiment, the semiconductor substrate 101 can be a silicon-on-insulator (SOI) substrate having an insulating layer on a polysilicon layer (not shown). In the present embodiment, the semiconductor substrate 101 is a silicon substrate.

Figure 2A:
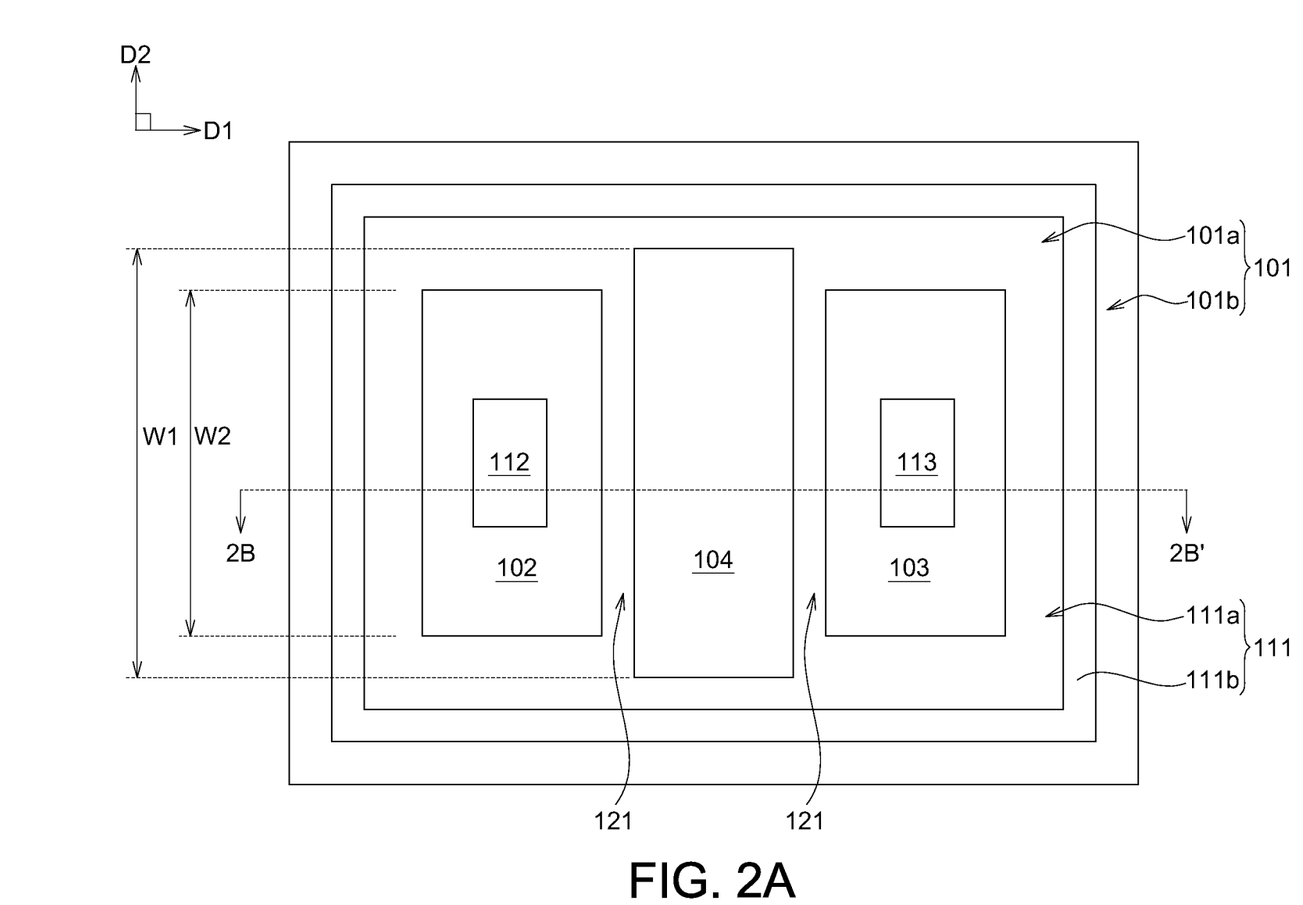
FIG. 2A is a top view illustrating the results, after a source diffusion region, a drain diffusion region and a channel diffusion region are formed in the semiconductor substrate.
Figure 2B:
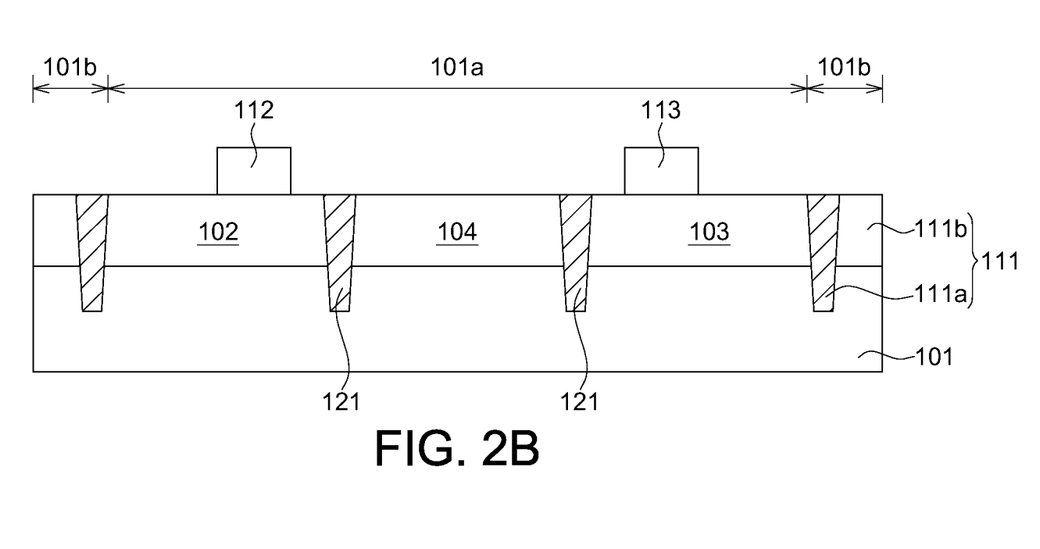
FIG. 2B is a cross-sectional view taken along the section line 2B-2B' depicted in FIG. 2A.

Next, a source diffusion region 102 and a drain diffusion region 103 and a channel diffusion region 104 are then formed in the semiconductor substrate 101. FIG. 2A is a top view illustrating the results, after the source diffusion region 102, the drain diffusion region 103 and the channel diffusion region 104 are formed in the semiconductor substrate 101. FIG. 2B is a cross-sectional view taken along the section line 2B-2B' depicted in FIG. 2B. In some embodiments of the present disclosure, the forming of the source diffusion region 102, the drain diffusion region 103 and the channel diffusion region 104 includes steps as follows:

An isolation structure 111 is firstly formed to at least divide the semiconductor substrate 101 into an active area 101a and an isolation area 101b, wherein the high-voltage device 100 is disposed in the active area 101a; and the isolation area 101b is disposed outside the active area 101a and surrounds the active area 101a. In some embodiments of the present disclosure, the isolation structure 111 may include a shallow trench isolation (STI) 111a and a guard ring 111b disposed around the STI 111a; and the guard ring 111b has a conductive type opposite to that of the source diffusion region 102 and the drain diffusion region 103. In the present embodiment, the conductive type of the source diffusion region 102 and the drain diffusion region 103 can be n-type, and the conductive type of the guard ring 111b can be p-type.

At least one ion implantation process is then performed to drive a plurality ion impurity into the active area 101a to form two separate doping regions serving as the source diffusion region 102 and the drain diffusion region 103. In some embodiments of the present disclosure, the remaining region of the active area 101a that is disposed between the source diffusion region 102 and the drain diffusion region 103 to connecting therewith can serve as the channel diffusion region 104. In the present embodiment, the channel diffusion region 104 can be formed by another ion implantation process, wherein the source diffusion region 102, the drain diffusion region 103 and the channel diffusion region 104 are fully separated and isolated by STI 121 formed in the active area 101a.

In some embodiments of the present disclosure, the source diffusion region 102 and the drain diffusion region 103 have a first conductive type; and the channel diffusion region 104 has a second conductive type opposite to the first conductive type. For example, in the present embodiment, the channel diffusion region 104 is doped with p-type dopants, such as boron (B), aluminum (Al), gallium (Ga), indium (In) or the arbitrary combinations thereof. The source diffusion region 102 and the drain diffusion region 103 are respectively doped with n-type dopants, such as phosphorus (P), arsenic (As), antimony (Sb) or the arbitrary combinations thereof; and the channel diffusion region 104 can be doped with p-type dopants, such as boron (B), aluminum (Al), gallium (Ga), indium (In) or the arbitrary combinations thereof. In other words, in the present embodiment, the first conductive type is n-type, and the second conductive type is p-type.

However, the first conductive type of the channel diffusion region 104 and the second conductive type of the source diffusion region 102 and the drain diffusion region 103 may not be limited to these regards. In some other embodiments, the channel diffusion region 104 can be doped with n-type dopants; and the source diffusion region 102 and the drain diffusion region 103 doped with p-type dopants (the first conductive type is p-type, and the second conductive type is n-type).

In the present embodiment, the source diffusion region 102, the channel diffusion region 104 and the drain diffusion region 103 are arranged along a first direction D1. Each of the source diffusion region 102, the channel diffusion region 104 and the drain diffusion region 103 extends along a second direction D2 perpendicular to the first direction D1. The channel diffusion region 104 has a first width W1 measured along the second direction D2 substantially greater than a second width W2 of the source diffusion region 102 and the drain diffusion region 103.

After the forming of the source diffusion region 102, the channel diffusion region 104 and the drain diffusion region 103, a source electrode 112 and a drain electrode 113 are respectively formed in the source diffusion region 102 and the drain diffusion region 103. In the present embodiment, the source electrode 112 and a drain electrode 113 are can be contact pads respectively connected to external circuits (not shown).

Figure 3A:
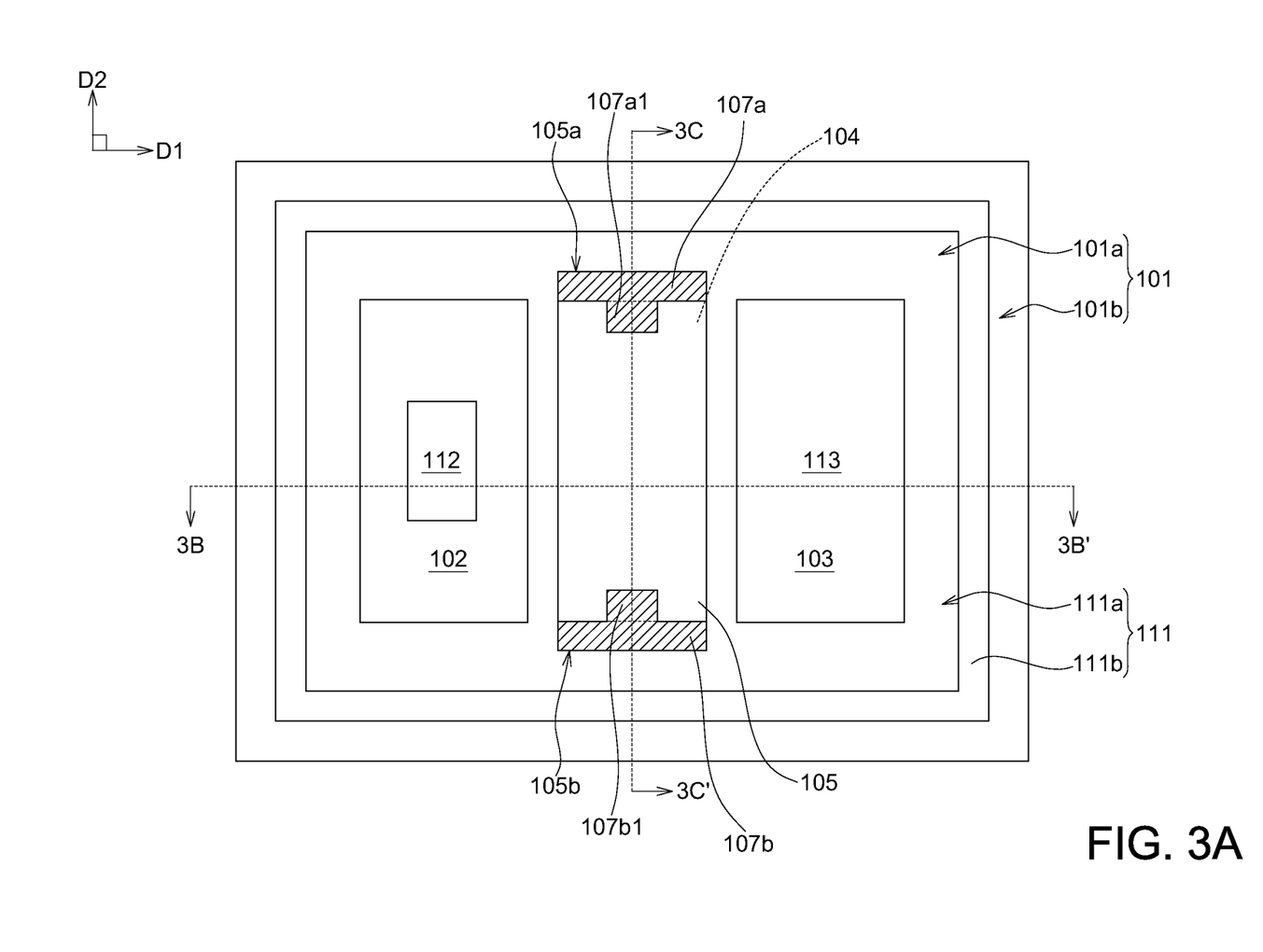
FIG. 3A is a top view illustrating the results after a gate dielectric layer is formed on the structure as depicted in FIG. 2.
Figure 3B:
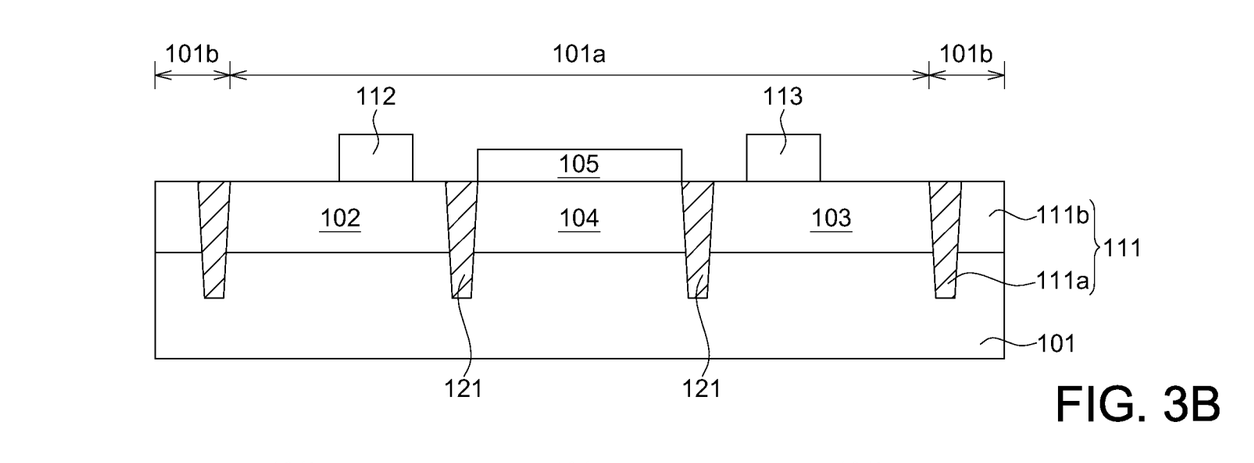
FIG. 3B is a cross-sectional view taken along the section line 3B-3B' depicted in FIG. 3A.
Figure 3C:
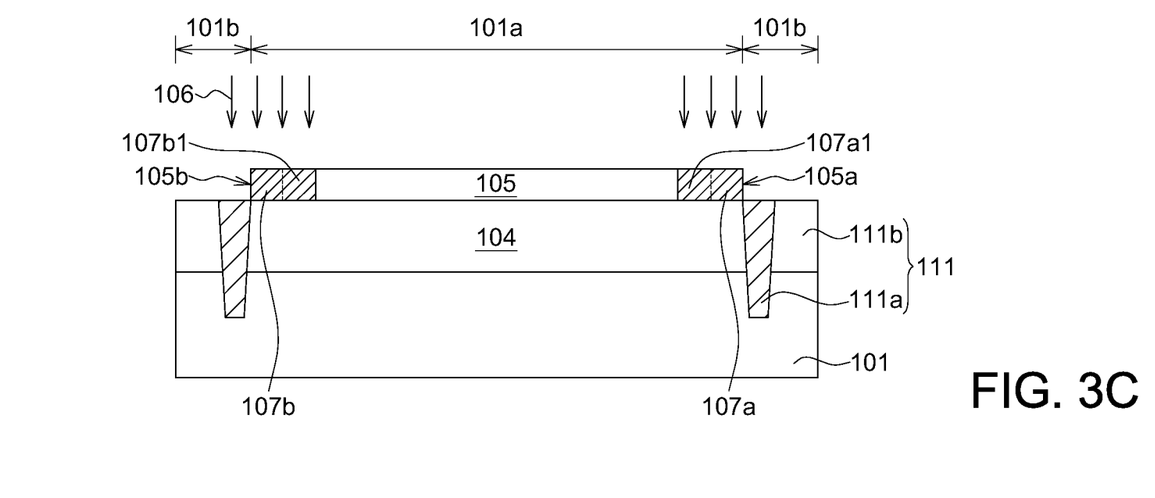
FIG. 3C is a cross-sectional view taken along the section line 3C-3C' depicted in FIG. 3A.

Thereinafter, a gate dielectric layer 105 is formed on the channel diffusion region 104 to cover the channel diffusion region 104, and another ion implantation process 106 is performed to drive a plurality of dopants with the second conductive type (the conductive type that is opposite to that of the source diffusion region 102 and the drain diffusion region 103, and is identical to that of the channel diffusion region 104) into the gate dielectric layer 105 to form a first modified portion 107a and a second modified portion 107b respectively extending inwards from a first edge 105a and a second edge 105b of the gate dielectric layer 105. In the present embodiment, the first modified portion 107a and the second modified portion 107b may include p-type dopants, such as B, Al, Ga, In or the arbitrary combinations thereof.

FIG. 3A is a top view illustrating the results after a gate dielectric layer 105 is formed on the structure as depicted in FIG. 2. FIG. 3B is a cross-sectional view taken along the section line 3B-3B' depicted in FIG. 3A FIG. 3C is a cross-sectional view taken along the section line 3C-3C' depicted in FIG. 3A.

In the present embodiment, the gate dielectric layer 105 totally covers on the channel diffusion region 104. The first edge 105a and the second edge 105b are respectively located on the opposite sides of the gate dielectric layer 105; both of them are arranged along a direction parallel to the second direction D2, and extend along a direction parallel to the first direction D1. The first modified portion 107a and the second modified portion 107b are separated with each other and arranged along the second direction D2. Each of the first modified portion 107a and the second modified portion 107b has a T-shaped top view. Merely the central arms portions 107a1 and 107b1 of the T-shaped first modified portion 107a and the T-shaped second modified portion 107b can overlap with the channel diffusion region 104.

However, the shape and arrangement as well as the forming steps of the first modified portion 107a and a second modified portion 107b are not limited to these regards. In some embodiments, the second modified portion 107b may be formed by another ion implantation process other than the ion implantation process 106 used to form the first modified portion 107a.

Figure 4A:
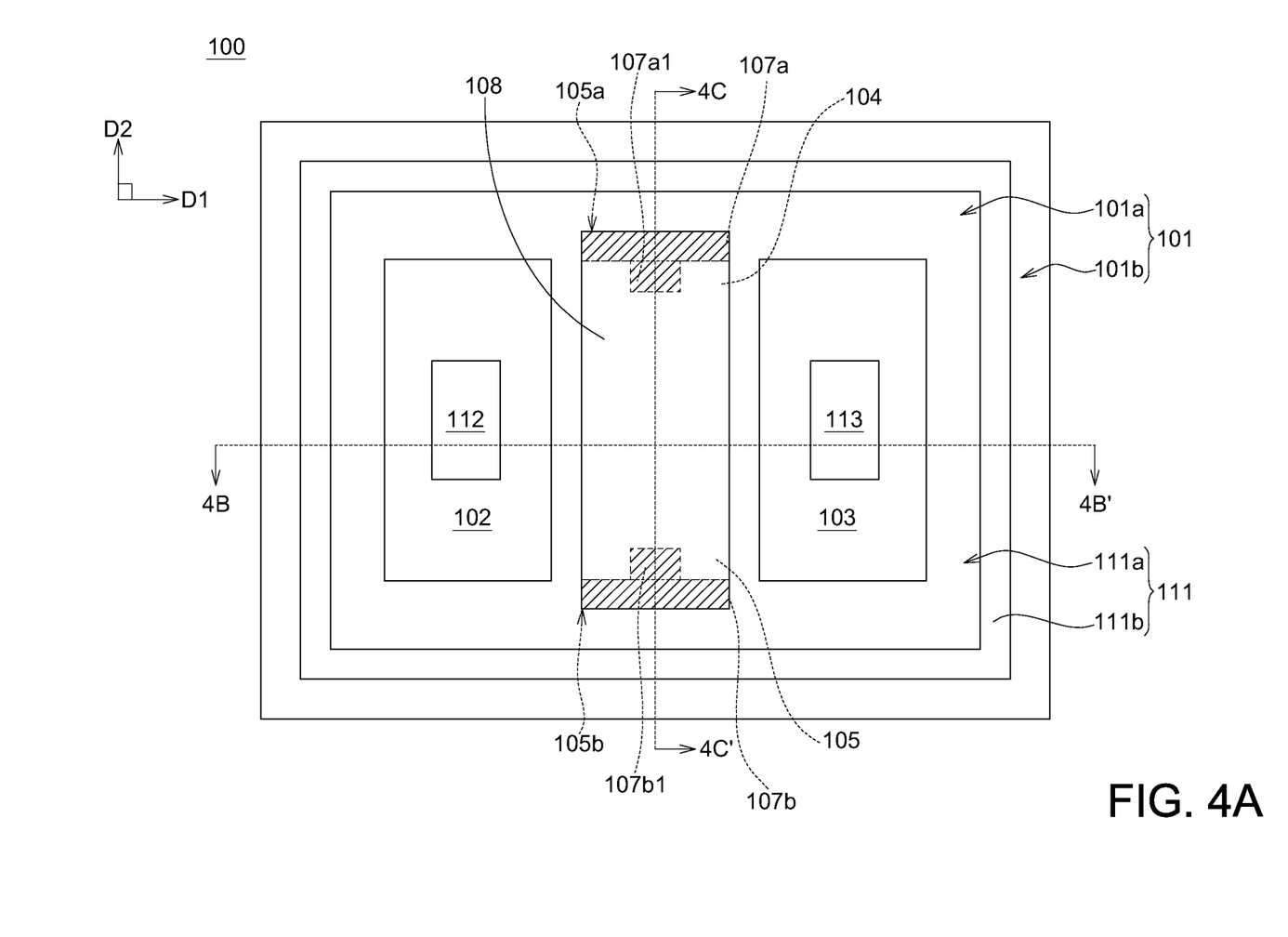
FIG. 4A is a top view illustrating the results after a gate electrode is formed on the structure as depicted in FIG. 3A.
Figures 4B, 4C:
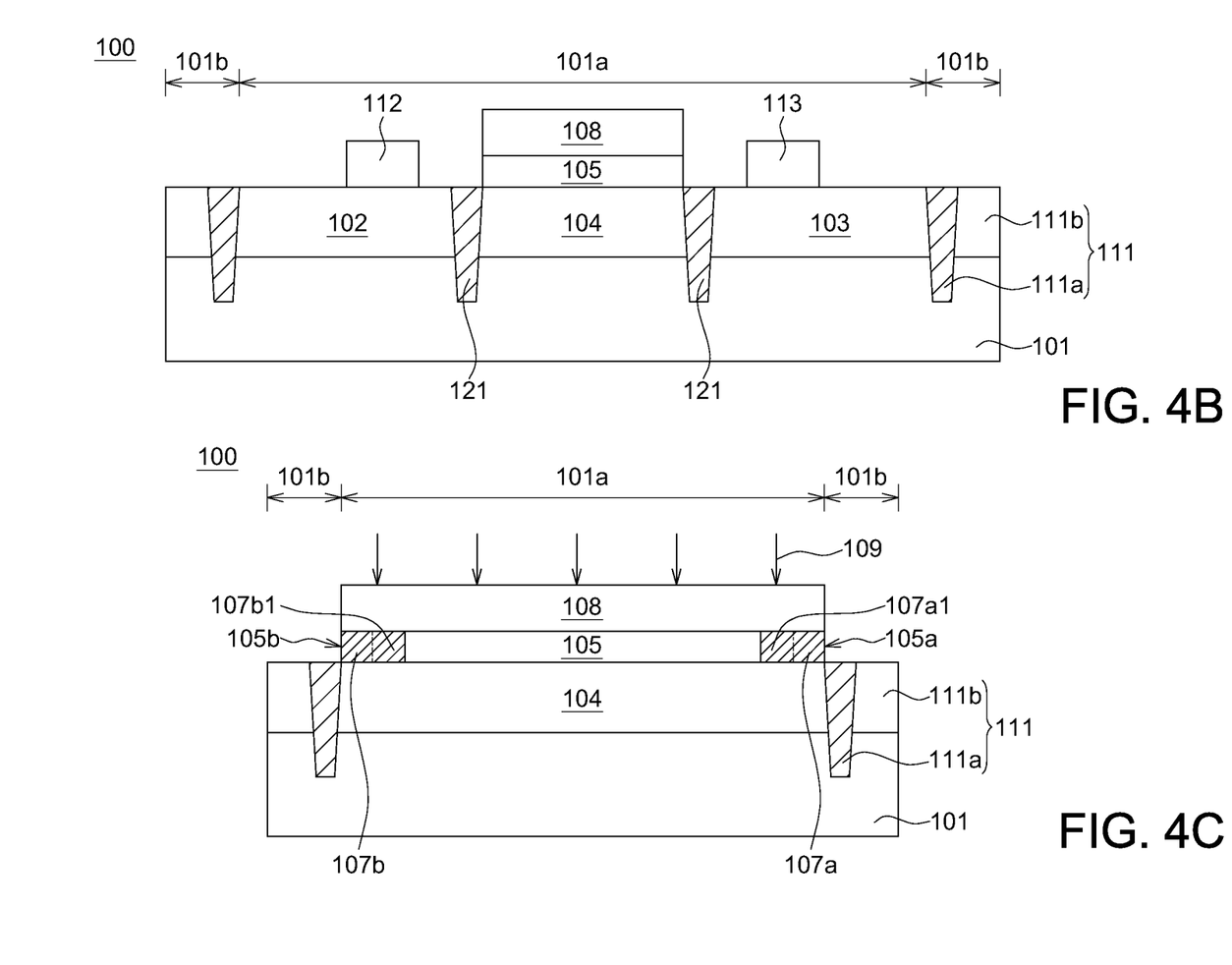
FIG. 4B is a cross-sectional view taken along the section line 4B-4B' depicted in FIG. 4A.
FIG. 4C is a cross-sectional view taken along the section line 4C-4C' depicted in FIG. 4A.

Subsequently, a gate electrode 108 is formed on the substrate 101 covering the gate dielectric layer 105 to make the first modified portion 107a and the second modified portion 107b at least partially overlapping with the gate electrode 108 and the channel diffusion region 104, meanwhile the process for forming the high-voltage device 100 as shown in FIGS. 4A to 4C is accomplished. In some embodiments of the present disclosure, the gate electrode 108 can be made of poly-silicon. In some other embodiments, the gate electrode 108 may include metal. In one embodiment, the gate electrode 108 may have a multilayers structure.

In the present embodiment, the gate electrode 108 has a lateral dimension substantially equal to that of the gate dielectric layer 105 and thoroughly overlaps with the gate dielectric layer 105. In other word, the gate electrode 108 can cover over the first edge 105a and the second edge 105b and a portion of the isolation structure 111 (the edge of the STI 111a); and merely the central arms portions 107a1 and 107b1 of the T-shaped first modified portion 107a and the T-shaped second modified portion 107b can overlap with the channel diffusion region 104 and the gate electrode 108.

The forming of the gate electrode 108 includes steps as follows: A deposition process, such as a chemical vapor deposition (CVD), is performed on the substrate 101 to form a polysilicon layer covering on the active area 101a (not shown). The polysilicon layer is then patterned by at least one etching process (not shown). After the patterning process, the remaining portion of the polysilicon layer is subjected to an ion implantation process 109 to drive a plurality of n-type dopants, such as P, As, Sb or the arbitrary combinations thereof, into the remaining poly-silicon layer.

Because the first modified portion 107a and the second modified portion 107b have conductive type (p-type) opposite to the conductive type (n-type) of the source diffusion region 102 and the drain diffusion region 103 (and identical to that of the channel diffusion region 104), the dielectric property of the gate dielectric layer 105 can be modified, thus the threshold voltage (Vt) of the high-voltage device 100 can be increased. In addition, the parasitic capacitance generated between the gate electrode 108 and the channel diffusion region 104 can be locally modified at the first edge 105a and the second edge 105b of the gate dielectric layer 105 by the forming of the first modified portion 107a and the second modified portion 107b. The current leakage due to the kink effect can thus be depressed and the snapback effect that can damage the high-voltage device can be prevented.

Figure 5A:
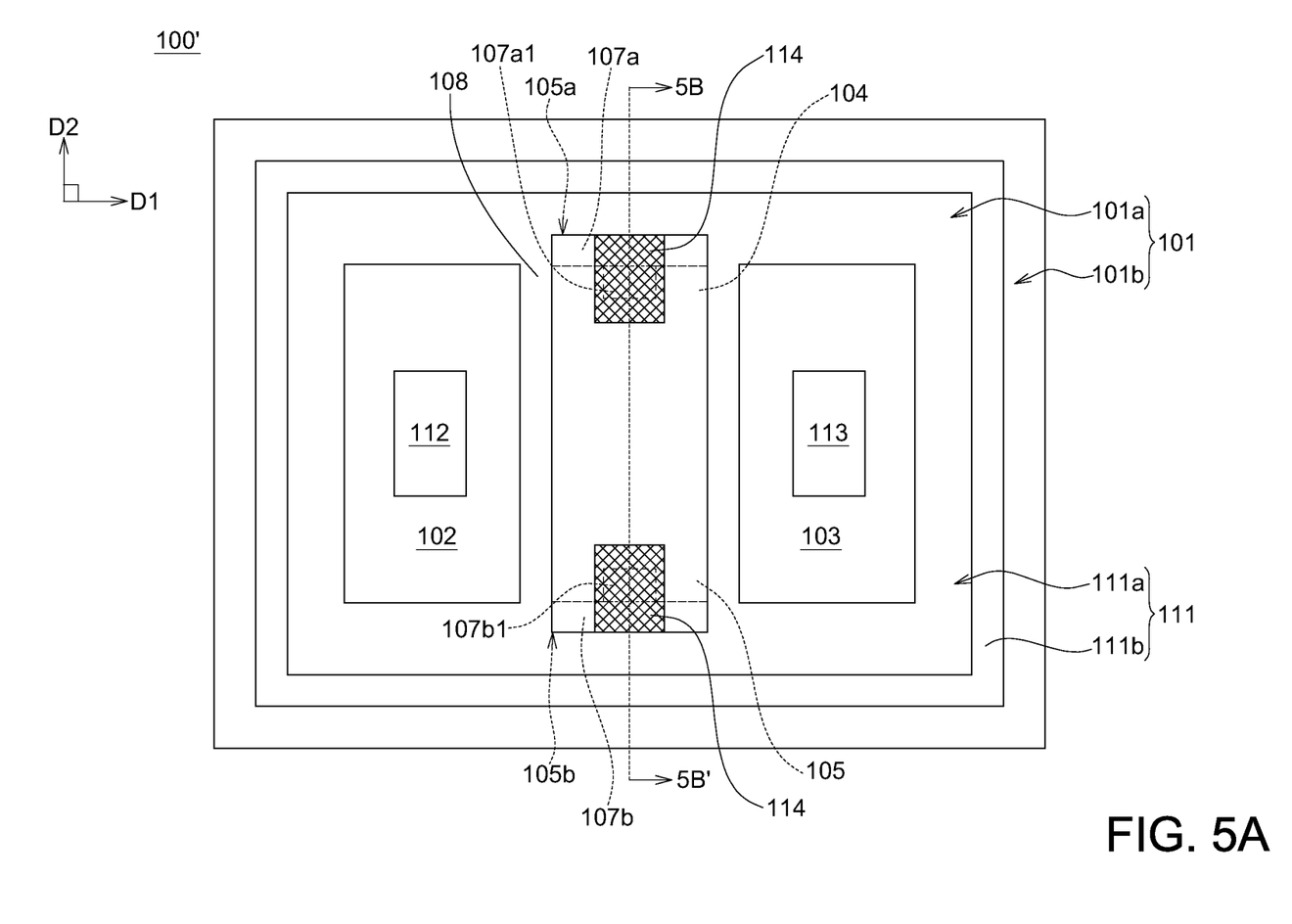
FIG. 5A is a top view illustrating the results after an optional ion implantation process is performed to drive a plurality of p-type dopants, into the edges of the gate electrode as depicted in FIG. 4A.
Figure 5B:
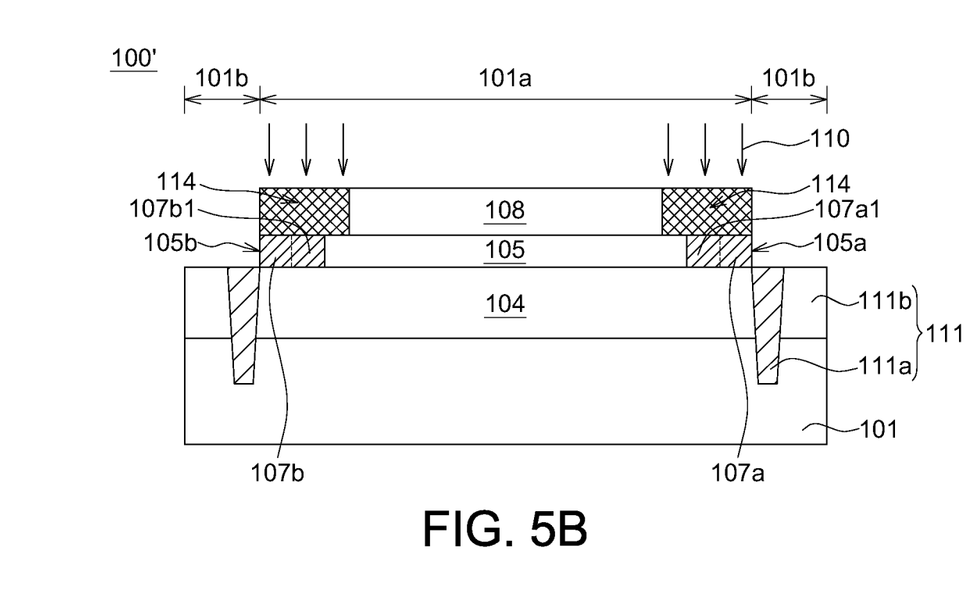
FIG. 5B is a cross-sectional view taken along the section line 5B-5B' depicted in FIG. 5A.

In some embodiments, an optional ion implantation process 110 may be performed, prior to or after the ion implantation process 109, to drive a plurality of dopants with the second conductive type (the conductive type that is opposite to that of the source diffusion region 102 and the drain diffusion region 103, and is identical to that of the channel diffusion region 104), into the edges of the gate electrode 108 to form at least one implantation region 114 covering portions of the first modified portion 107a and the second modified portion 107b (see FIGS. 5A and 5B) for tuning the work function of the gate electrode 108 in a manner of increasing the threshold voltage (Vt) of the high-voltage device 100'. In the present embodiment, the implantation region 114 may include p-type dopants, such as B, Al, Ga, In or the arbitrary combinations thereof.

In accordance with the aforementioned embodiments of the present disclosure, a high-voltage device and the method for fabricating the same are provided. After forming a source diffusion region, a drain diffusion region and a channel diffusion region in the semiconductor substrate, a gate dielectric layer having a modified portion with a conductivity type other than that of the source diffusion region and the drain diffusion region is formed on the channel diffusion region. A gate electrode is then formed on the gate dielectric layer to make the modified portion, the gate electrode and the channel diffusion region at least partially overlapping with each other.

Because the modified portion has conductive type opposite to that of the source diffusion region and the drain diffusion region that can modify the dielectric property of the gate dielectric layer, thus the threshold voltage (Vt) of the high-voltage device can be increased. In some embodiments of the preset disclosure, the modified portion may extend inwards from an edge of the gate dielectric layer to provide a local-increased parasitic capacitance at the edge of the gate dielectric layer which is located between the drain diffusion region and the source diffusion region and adjacent to the device insulation structure, to prevent current leakage due to the kink effect and the snapback effect that can damage the high-voltage device from being triggered.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A high-voltage device, comprising:
   a semiconductor substrate;
   a source diffusion region and a drain diffusion region with a first conductive type disposed in the semiconductor substrate;
   a channel diffusion region disposed in the semiconductor substrate and between the source diffusion region and the drain diffusion region;

a gate dielectric layer, disposed on the channel diffusion region, the gate dielectric layer having a first modified portion with a second conductive type extending inwards from a first edge of the gate dielectric layer and a second modified portion with the second conductive type extending inwards from a second edge of the gate dielectric layer opposite to the first edge, wherein the first modified portion and the second modified portion of the gate dielectric layer are horizontally disposed at the first edge and the second edge of the gate dielectric layer respectively in a top view; and a gate electrode, disposed on the gate dielectric layer, wherein the first modified portion of the gate dielectric layer, the gate electrode and the channel diffusion region at least partially overlap with each other;

wherein in the top view, the source diffusion region, the channel diffusion region and the drain diffusion region are arranged along a first direction, the first modified portion and the second modified portion of the gate dielectric layer are arranged space apart along a second direction, the first direction is perpendicular to the second direction, one of the first modified portion and the second modified portion is T-shape in the top view.

2. The high-voltage device according to claim 1, wherein the second modified portion of the gate dielectric layer, the gate electrode and the channel diffusion region at least partially overlap with each other.

3. The high-voltage device according to claim 1, wherein the first edge and the second edge of the gate dielectric layer are arranged along the second direction.

4. The high-voltage device according to claim 1, wherein the gate electrode comprises poly silicon.

5. The high-voltage device according to claim 1, wherein the gate electrode comprises metal.

6. The high-voltage device according to claim 1, wherein the first conductive type is n-type and the second conductive type is p-type.

7. The high-voltage device according to claim 1, wherein the first conductive type is p-type and the second conductive type is n-type.

8. The high-voltage device according to claim 1, further comprising an isolation structure disposed adjacent to the first edge of the gate dielectric layer.

9. The high-voltage device according to claim 8, wherein the gate electrode covers over the first edge of the gate dielectric layer and the isolation structure.

10. The high-voltage device according to claim 1, further comprising an implantation region having the second conductive type disposed on edges of the gate electrode at least partially covering the first modified portion of the gate dielectric layer.

* * * * *